US 6,665,054 B2

(12) United States Patent
Inoue

(10) Patent No.: US 6,665,054 B2
(45) Date of Patent: Dec. 16, 2003

(54) TWO STAGE METHOD

(75) Inventor: Fuyuhiko Inoue, San Mateo, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/036,976

(22) Filed: Oct. 22, 2001

(65) Prior Publication Data

US 2003/0076482 A1 Apr. 24, 2003

(51) Int. Cl.[7] .................. G03B 27/32; G03B 27/42; G03B 27/44; G03B 27/58
(52) U.S. Cl. ................ 355/77; 355/46; 355/53; 355/72
(58) Field of Search .................. 355/46, 53, 72, 355/77

(56) References Cited

U.S. PATENT DOCUMENTS

| 4,215,938 A | 8/1980 | Farrand et al. |
| 5,114,234 A | 5/1992 | Otsuka et al. |
| 5,151,749 A | 9/1992 | Tanimoto et al. |
| 5,187,543 A | 2/1993 | Ebert |
| 5,365,342 A | 11/1994 | Ayata et al. |
| 5,379,115 A | 1/1995 | Tsai |
| 5,392,120 A | 2/1995 | Kamiya |
| 5,504,407 A | 4/1996 | Wakui et al. ......... 318/568.17 |
| 5,523,839 A | 6/1996 | Robinson et al. |
| 5,528,118 A | 6/1996 | Lee |
| 5,537,209 A | 7/1996 | Lis |
| 5,677,758 A | 10/1997 | McEachern et al. ......... 355/75 |
| 5,715,064 A | 2/1998 | Lin ...................... 356/401 |
| 5,724,136 A | 3/1998 | Zanoni |
| 5,790,253 A | 8/1998 | Kamiya |
| 5,969,441 A | 10/1999 | Loopstra et al. ............ 310/12 |
| 5,991,034 A | 11/1999 | Ohtsuka |
| 6,020,964 A | 2/2000 | Loopstra et al. ........... 356/358 |
| 6,118,515 A | 9/2000 | Wakamoto et al. .......... 355/53 |
| 6,262,796 B1 | 7/2001 | Loopstra et al. |
| 6,313,918 B1 | 11/2001 | Hill et al. |
| 6,400,441 B1 * | 6/2002 | Nishi et al. ................ 355/53 |
| 6,417,914 B1 * | 7/2002 | Li ........................... 355/75 |
| 2002/0026878 A1 | 3/2002 | Kwan et al. ............. 101/463.1 |
| 2003/0076482 A1 | 4/2003 | Inoue |

FOREIGN PATENT DOCUMENTS

| EP | 1 041 357 A1 | 10/2000 |
| WO | WO 98/40791 | 9/1998 |
| WO | WO 99/32940 | 7/1999 |

OTHER PUBLICATIONS

Van Zant, "Microchip Fabrication, A Practical Guide to Semiconductor Processing", Fourth Edition, McGraw–Hill, pp. 236 and 611.

* cited by examiner

Primary Examiner—Rodney Fuller
(74) Attorney, Agent, or Firm—Pennie & Edmonds LLP

(57) ABSTRACT

The method for positioning two stages during semiconductor wafer processing facilitates the use of two stages to improve system throughput by decreasing the rest-time of certain system components. While a typical single-stage apparatus requires that each step in the process be performed serially, this invention allows an amount of parallel processing with each stage at different steps of the process, and thus improves system throughput.

16 Claims, 14 Drawing Sheets

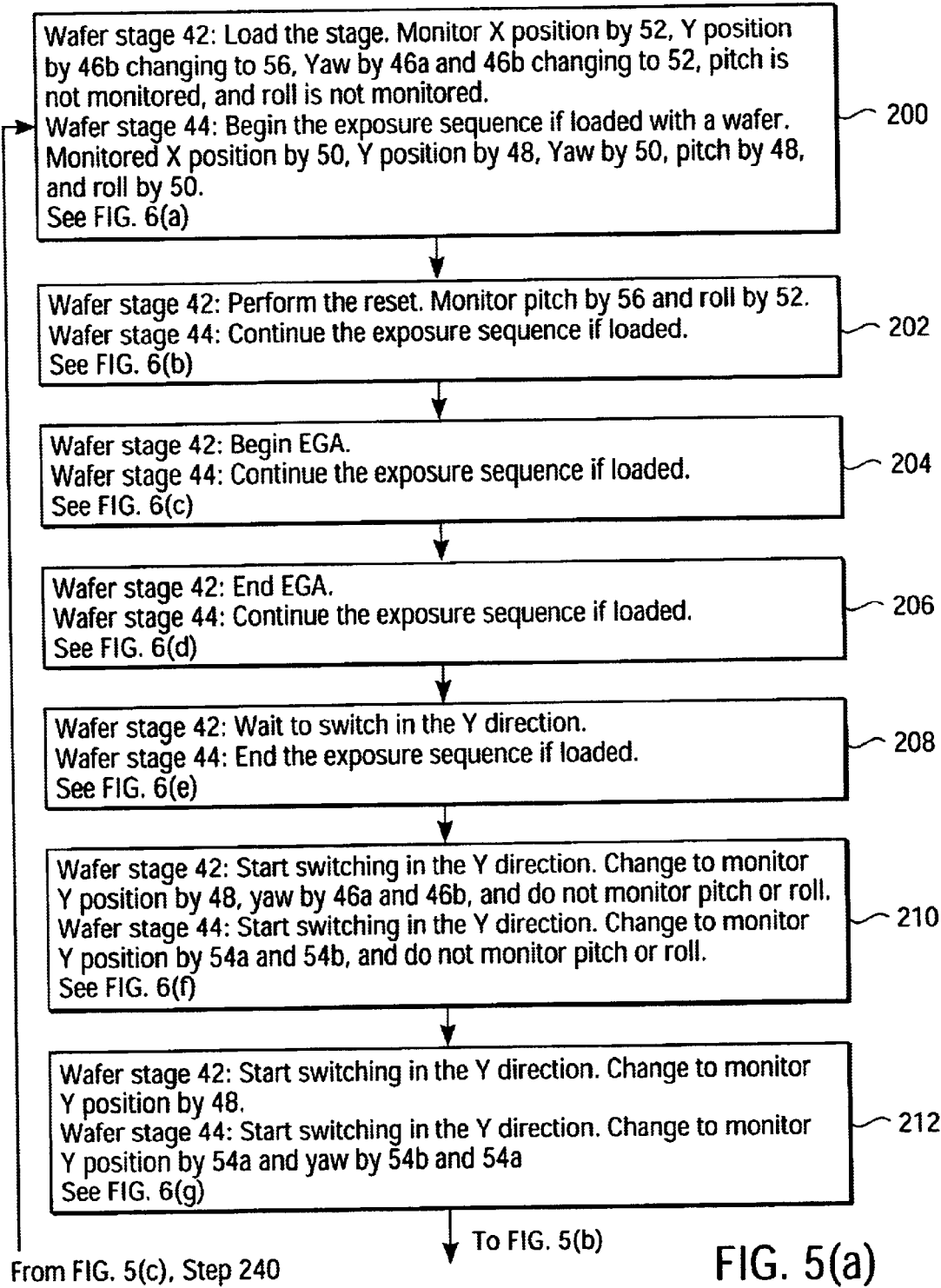

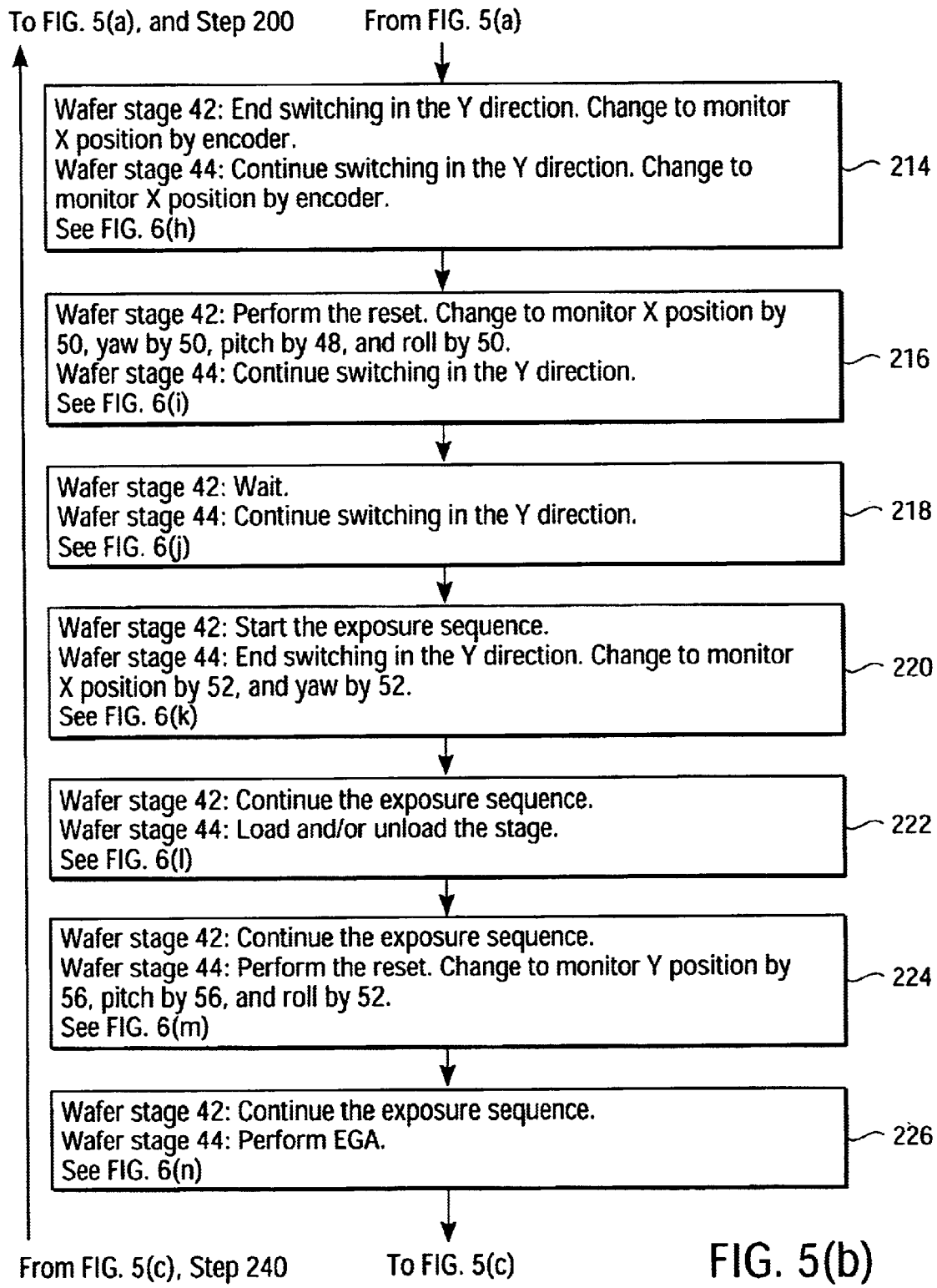

TWO STAGE METHOD

FIELD OF THE INVENTION

The invention relates to lithography instruments used for patterning and processing substrates such as semiconductor chips and wafers. More specifically, the invention is concerned with a method for positioning stages during the processing of the substrates affixed to those stages.

BACKGROUND OF THE INVENTION

In lithography processes the image from a reticle is transferred to a substrate, typically a wafer. System throughput is dependent upon the speeds of many separate steps that are performed in series. Throughput is therefore dependent on the duration of each step, which can include: loading, field image alignment, global alignment, and exposure.

The production of an acceptable final product requires the complex interaction of the systems necessary to implement each step. This complexity creates time requirements of its own. For example, when exposing patterns on wafers and other substrates, the reticle is moved at high speeds between discrete and precise positions to facilitate focusing the image on the substrate. This motion can generate dynamic reaction forces where the reticle is supported, leading to distortion of the reticle and, hence, distortion of the image focused on the substrate. Both reticle and wafer must be given time to settle to reduce the vibration that can cause distortion of the transferred pattern. Lithography processes typically occur in a clean room/vacuum environment; this is a source of further complexity and also an indication of the sensitivity of the processes.

A typical exposure apparatus employing a single wafer stage is shown in FIG. 1 and FIG. 2. Exposure apparatus 10 transfers a pattern of an integrated circuit from reticle 12 onto semiconductor wafer 14. Apparatus frame 16 preferably is rigid and supports the components of exposure apparatus 10. These components include: reticle stage 18, wafer stage 20, lens assembly 22, and illumination system 24. Alternatively, separate, individual structures (not shown) can be used to support wafer stage 20, reticle stage 18, illumination system 24, and lens assembly 22.

Illumination system 24 includes an illumination source 26 and an illumination optical assembly 28. Illumination source 26 emits an exposing beam of energy such as light or electron energy. Optical assembly 28 guides the beam from illumination source 26 to lens assembly 22. The beam illuminates selectively different portions of reticle 12 and exposes wafer 14. In FIG. 1, illumination source 26 is illustrated as being supported above reticle stage 18. Typically, however, illumination source 26 is secured to one of the sides of apparatus frame 16 and the energy beam from illumination source 26 is directed to above reticle stage 18 with illumination optical assembly 28. Where illumination source 26 is an electron beam, the optical path for the electron beam should be in a vacuum.

Lens assembly 22 projects and/or focuses the light passing through reticle 12 to wafer 14. Depending upon the design of apparatus 10, lens assembly 22 can magnify or reduce the image illuminated on reticle 12.

Reticle stage 18 holds and precisely positions reticle 12 relative to lens assembly 22 and wafer 14. Similarly, wafer stage 20 holds and positions wafer 14 with respect to the projected image of the illuminated portions of reticle 12. In the embodiment illustrated in FIG. 1 and FIG. 2, wafer stage 20 and reticle stage 18 are positioned by shaft-type linear motors 30. Depending upon the design, apparatus 10 may include additional servo drive units, linear motors and planar motors to move wafer stage 20 and reticle stage 18, but other drive and control mechanisms may be employed.

The basic device as described may be used in different types of lithography processes. For example, exposure apparatus 10 can be used in a scanning type lithography system, which exposes the pattern from reticle 12 onto wafer 14 with reticle 12 and wafer 14 moving synchronously. In a scanning type lithography process, reticle 12 is moved perpendicular to an optical axis of lens assembly 22 by reticle stage 18, and wafer 14 is moved perpendicular to an optical axis of lens assembly 22 by wafer stage 20. Scanning of reticle 12 and wafer 14 occurs while reticle 12 and wafer 14 are moving synchronously.

Alternatively, exposure apparatus 10 may be employed in a step-and-repeat type lithography system that exposes reticle 12 while reticle 12 and wafer 14 are stationary. In the step-and-repeat process, wafer 14 is in a constant position relative to reticle 12 and lens assembly 22 during the exposure of an individual field. Subsequently, between consecutive exposure steps, wafer 14 is consecutively moved by wafer stage 20 perpendicular to the optical axis of lens assembly 22 so that the next field of semiconductor wafer 14 is brought into position relative to lens assembly 22 and reticle 12 for exposure. Following this process, the images on reticle 12 are sequentially exposed onto the fields of wafer 14.

Processing a single wafer requires a significant time expenditure because of the complexity and sensitivity of the exposure apparatus and the steps involved. When a single wafer is undergoing one step, the apparatus for the others are normally idle. For example, when a single wafer is being exposed the apparatus for determining the alignment of the wafer relative to the wafer stage is typically idle. Consumer demand for the end product has created a need for increased throughput and, thus, the development of methods to decrease the idle time. A way to decrease idle time is to use two stages and position them so that each stage can undergo different steps of the process at the same time. The present invention is a method that uses two stages that run simultaneously, but with each stage at different steps in the process. This method relies upon a combination of encoders and interferometers to determine the position of each stage at any given point throughout processing. Encoders being rather less accurate than interferometers; the method preferably relies on them during the less position-sensitive steps of the process.

SUMMARY OF THE INVENTION

The present invention provides a two stage method where stage position may be determined using interferometers and one or more encoders. The stage assembly includes a plurality of interferometers mounted on a base for determining stage positions and encoders where interferometers are not feasible. The two stages move between multiple positions on the base and have mirrors affixed to them that cooperate with the other interferometer components to provide position data. At times, the two stages are positioned so that the first stage eclipses the second stage with respect to said at least one of the interferometers. Should such an eclipse occur, and another interferometer not be available for determining the eclipsed stage's position, an encoder is configured to supply position. The apparatus is designed so that encoders are required during the less position-sensitive steps of the process, such as when switching from one step to another.

A method incorporating the invention comprises: sizing the stages based on wafer and exposure apparatus parameters; dispersing interferometers and encoders about the base at appropriate positions based on the stage sizes; moving the stages as desired while using the exposure apparatus; and determining the positions of both stages at all times during the process.

BRIEF DESCRIPTION OF THE DRAWINGS

The foregoing and other aspects and advantages will be better understood from the following detailed description of the preferred embodiment of the invention with reference to the drawings, in which:

FIGS. 5(a)–(e) is a flowchart illustrating a method according to the present invention.

DETAILED DESCRIPTION OF THE INVENTION

Figure 1:
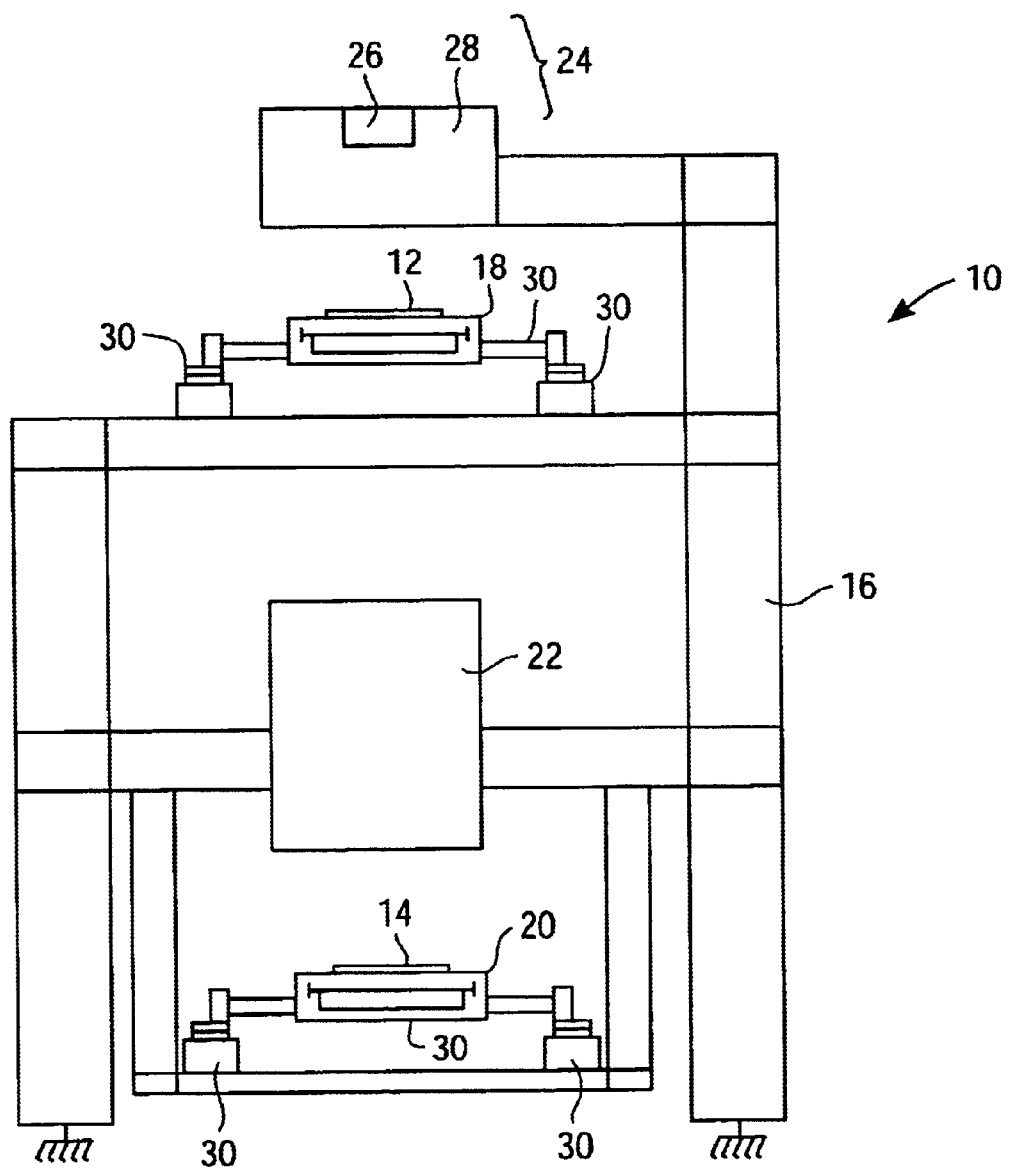
FIG. 1 is a side view of a lithography exposure apparatus of the prior art.
Figure 2:
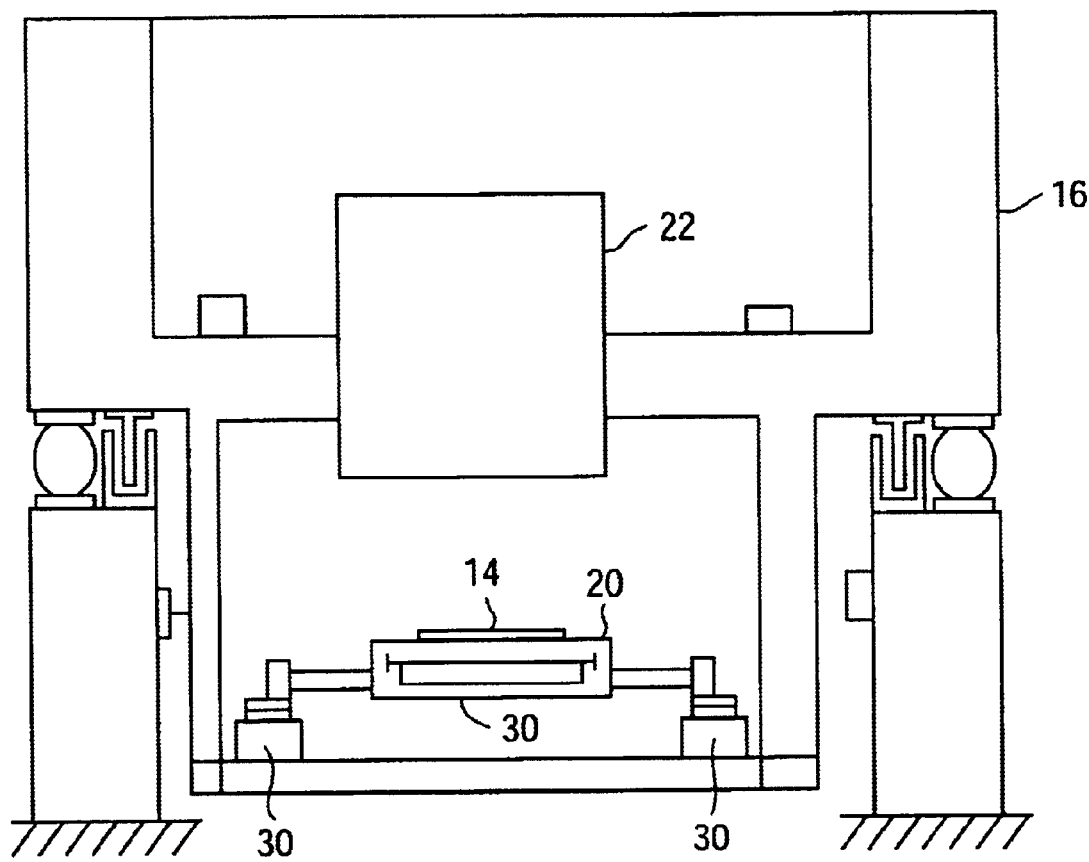
FIG. 2 is a different side view of a lithography exposure apparatus of the prior art.
Figure 3:
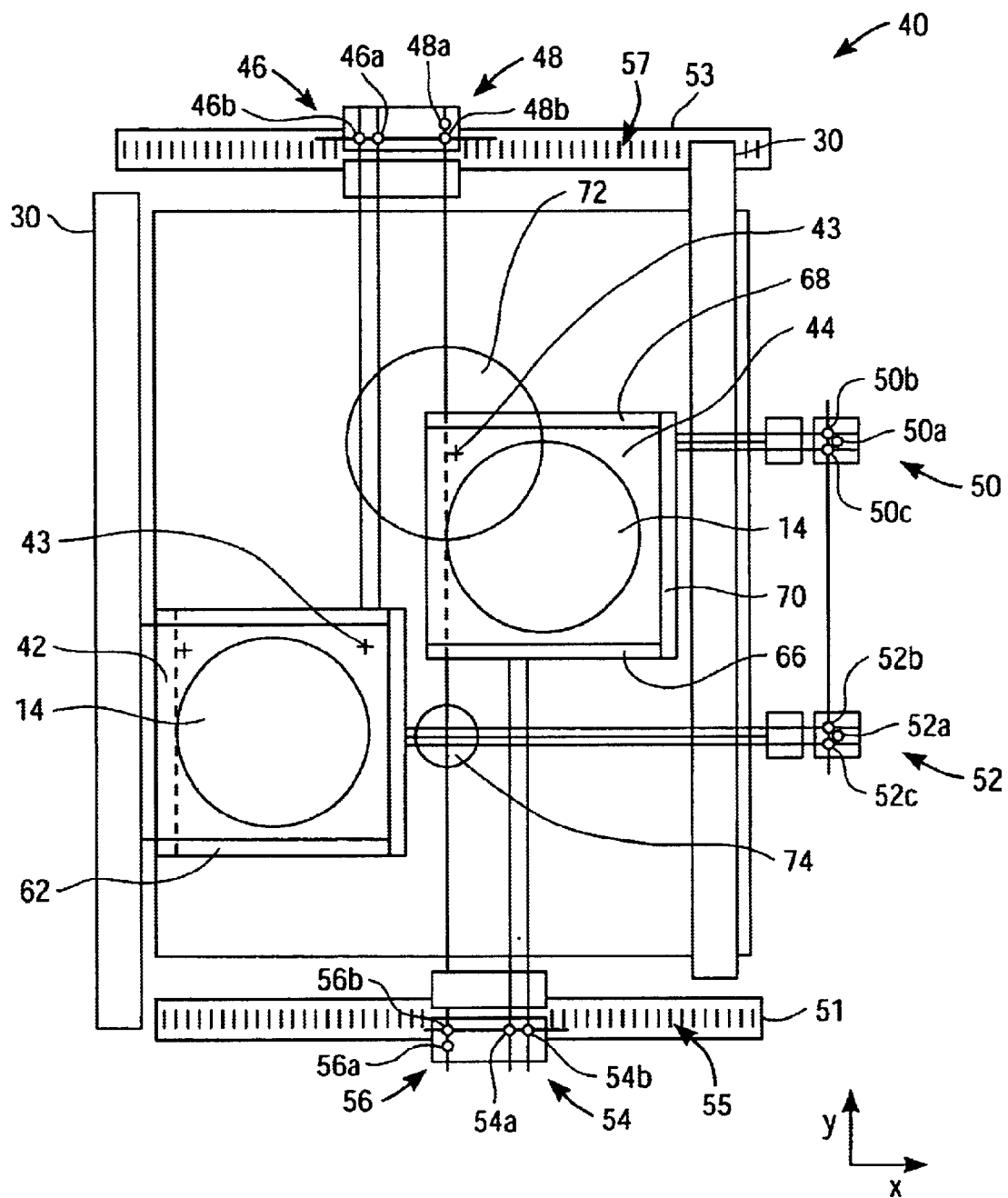
FIG. 3 is a plan view of a two wafer stage assembly employed in a preferred embodiment of the present invention.

Referring now to FIG. 3, in which dual wafer stage assembly 40 is illustrated from above according to a preferred embodiment of the invention. Two wafer stage assembly 40 provides the capability for the system to rely on interferometers 46, 48, 50, 52, 54, 56 and encoders 55 and 57 to determine the position of wafer stages 42 and 44 during processing. Dual wafer stage assembly 40 generally comprises a first wafer stage 42, a second wafer stage 44, a base 60, and the interferometers and encoders mentioned above. Each interferometer cooperates with a reflective surface (mirror) 58, 62, 64, 66, 68, and 70 mounted on stages 42 and 44 so that they reflect back to the intended interferometers. Elements of base 60 necessary for the support, positioning, and movement of wafer stages 42 and 44 are illustrated as support elements 30 in FIG. 3 for purposes of clarity, but, as one of skill in the art would recognize, these functions may be accomplished by the shaft-type linear motors 51 and 53, depicted schematically, or other known actuators and additional static support elements of the prior art (see FIGS. 1 & 2).

As shown in FIG. 3, projection lens area 72 refers to the point where the image from reticle 12 (of FIG. 1) is focused by the projection apparatus onto stage assembly 40. Area 74 identifies an area that an operator views from above (typically with a microscope) to align wafer 14 with, eventually, reticle 12. Area 74 is referred to as the field image alignment (FIA) area 74.

Overall apparatus alignment is a multi-step process designed to obtain an accurate alignment of the image of reticle 12 on wafer 14. Alignment is performed by determining the position of wafer 14 relative to wafer stage 42 or 44 in FIA area 74 using a microscope, for example, to determine the positions of selected marks or elements on wafer 14 relative to fiducial mark 43 on stage 42 or 44. These elements are preferably dispersed about the wafer surface so as to provide data about the entire surface, or "global" data. These elements could be marks on the wafer dedicated for this purpose similar to the fiduciary mark in the wafer stage, or the elements could be images formed by previous exposures, or otherwise formed. Only some of these marks are measured, with that data used in calculations to estimate all chip positions. With the additional "global" data, the chip position relative to the fiducial mark is determined more precisely, or "enhanced". Thus, with the additional calculations for estimating each chip position, this procedure is known as "enhanced global alignment" (EGA). Global alignment must be performed after each time a new wafer is loaded.

To determine the position of the image of reticle 12 with respect to apparatus 10, called a "reset," stage 42 or 44 is positioned with fiducial mark 43 at projection lens area 72. Then interferometer data is taken of stage position and a reticle alignment microscope (not shown) is used to determine the position of fiducial mark 43 with respect to the image of reticle 12. With this image to fiducial mark data, and fiducial mark to apparatus data, the position of the image of reticle 12 with respect to apparatus 10 is determined. A similar procedure is conducted to determine the position of FIA area 74 using fiducial mark 43. These procedures are called "resets" with one for FIA area 74 and another for the reticle and projection lens 72. With both the position of the image of reticle 12, and the position of FIA area 74 determined with respect to fiducial mark 43, and with the position of wafer 14 determined with respect to fiducial mark 43, the position of the image of reticle 12 can be accurately positioned on wafer 14.

The alignment is a multistep process, using both a reset for FIA area 74 and a reset step for projection lens area 72, because more traditional methods of relating reticle image to wafer position can interfere with processing in this twin stage method. With two stages, it is preferable to process wafer 14 on one stage while performing an EGA reset and EGA on the second stage. Traditional alignment methods, as is known to one of skill in the art, direct projection lens area 72 and FIA area 74 to fiducial marks on the same stage during alignment.

A reset must be performed after a reticle is changed. So long as reticle 12 does not change and apparatus 10 is stable enough, a reset need not be performed at every wafer loading unless particularly precise exposures are required. Resets are, however, typically performed after several wafer exposures. One of skill in the art will recognize that many methods may be employed to align the reticle image with the field image alignment microscope.

Interferometer 50 is positioned at approximately the center Y-position of projection lens area 72 and is mainly used for determining the stage X-position, yaw, and roll during exposure. Interferometer 52 is positioned at approximately the center Y-position of FIA area 74 microscope and is mainly used for determining the X-position, yaw, and roll during EGA. Interferometer 48 is positioned at approximately the X-position of projection lens area 72 and is mainly used for determining stage Y-position and pitch during exposure. Similarly, interferometer 56 is positioned at approximately the center X-position of FIA area 74 and is mainly used for determining stage Y-position and pitch during EGA. Remaining interferometers 46 and 54 are mainly used during the switching or waiting steps because, since they are offset from the lens assembly and FIA focal points, any error in the data they produce is compounded by the offset.

Mirrors 58, 62, 64, 66, 68, and 70 are known as "moving mirrors" because they move with wafer stages 42 and 44. As is understood by persons skilled in the art, other non-moving mirrors known as "reference mirrors" are located within the interferometers 46, 48, 50, 52, 54 and 56, but in order to clarify the schematic representation of the invention standard reference beams, reference mirrors, and sensors for each interferometer are not shown.

Linear motors 51 and 53 position wafer stages 42 and 44 in the X-direction respectively. Encoders 55 and 57 are located beneath linear motors 51 and 53 and are illustrated as gratings. Encoders 55 and 57 provide X-position data when stage movement causes one stage to eclipse the other from interferometers 50 or 52. In the preferred embodiment shown this occurs when the stages are switching in the Y direction. At that time X position is not as critical and the less precise measurements given by encoders are adequate.

Figure 4A:
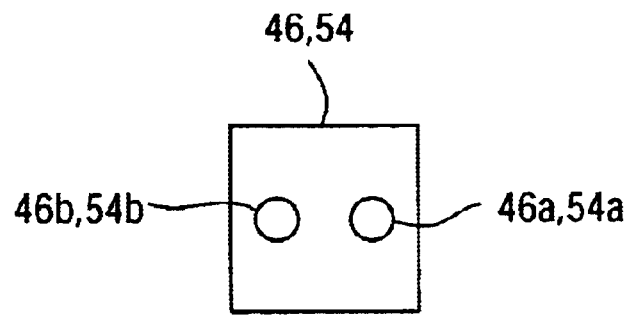
FIGS. 4(a)–(c) illustrate the interferometer axes as seen from the wafer stages.
Figure 4B:
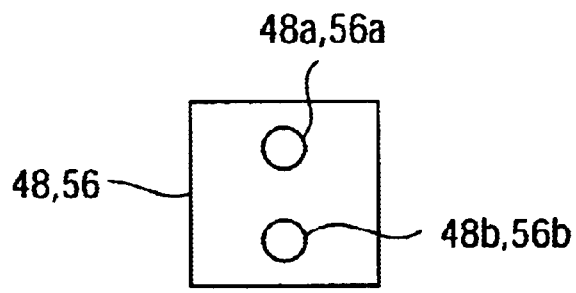
Figure 4C:
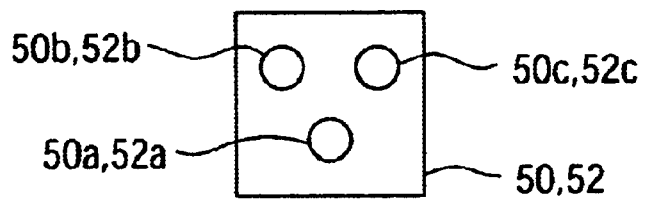

The individual axes (beams) of interferometers 46, 48, 56, 52, 50, and 54 are configured and utilized either singularly or in combination to make possible the measurements necessary at any particular moment. For example, although interferometer 46b is most often used to provide yaw data for stage 42, it also provides Y-position data at the end of the exposure sequence for stage 42. In a preferred embodiment, the present invention employs two and three axes interferometers that are incident on wafer stages 42 and 44 from three sides as well as encoders 55 and 57 to determine wafer stage position at all times. As shown in FIG. 3 and FIGS. 4(*a*)–(*c*), the axes of the interferometers are directed in parallel towards the moveable mirrors on stages 42 and 44, but are arranged to provide position data from different points on the moveable mirrors. Position data from one axis may therefore be combined with position data from one or more other axes and manipulated to yield stage yaw and pitch. As is well known to one of skill in the art, the spacing between axes necessary for them to combine to yield yaw and pitch data is infinitely variable in three dimensions so long as the beam is incident upon the desired mirror.

Continuing with FIG. 3, and viewing the interferometers in more detail in FIG. 4, interferometers 50 and 52 each have 3 axes 50a, 50b, 50c, 52a, 52b, and 52c and is used to determining X position, yaw, and roll. Interferometers 46, 48, 54, 56 each have 2 axes 46a, 46b, 48a, 48b, 54a, 54b, 56a, and 56b and are used to determine Y position and yaw. Only interferometers 48 and 56 are used to determine pitch.

In a preferred embodiment shown in FIG. 3 interferometers 48, 50, 52, and 56 are directed so their axes intersect at approximately the center of the most sensitive areas. Interferometers 48 and 50 intersect at projection lens area 72 where the projection lens focuses the image from the reticle. Interferometers 52 and 56 similarly intersect at field image alignment point 74. Remaining interferometers 46 and 54 and encoders are relied upon during the less critical movements; interferometers 46 and 54 because they are offset from the positions of interest and the encoders because they are less precise.

Where the interferometers, encoders, stages, and base are properly configured and dimensioned, the present invention provides a method that increases system throughput by reducing the idle time of the individual system components. Idle time is reduced by providing a second substrate upon a second stage without interfering with the steps being performed on the first stage.

As illustrated in FIG. 3, the dimensions of the first and second stages are the same. One of skill in the art, however, will understand that the present invention can be practiced with stage dimensions of infinite variety. This is due to the different potential ranges of values possible for each of the variables involved in stage design and the changes possible with the configurations of the stages, mirrors, and other elements.

Figure 5C:
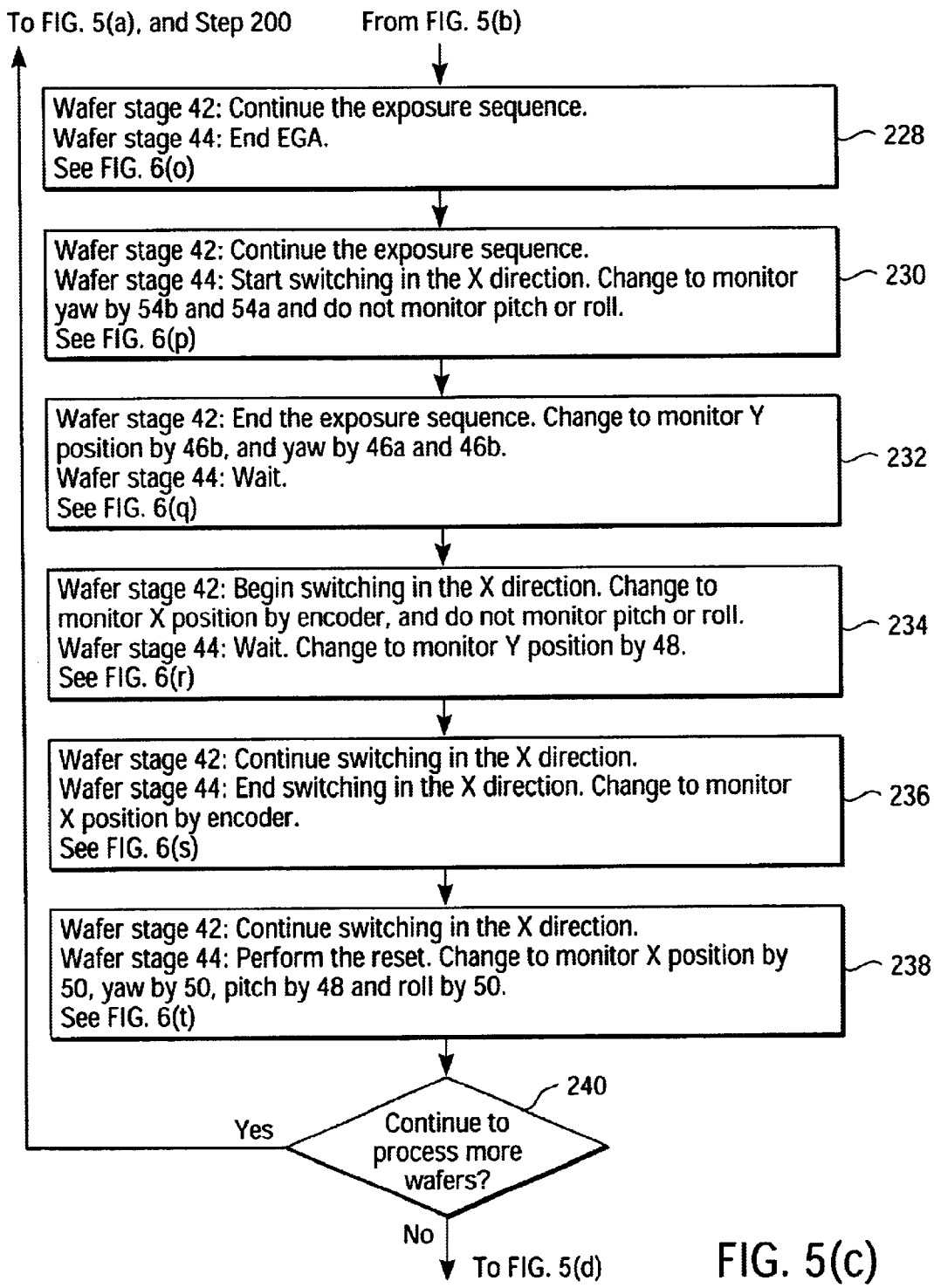
Figure 5D:
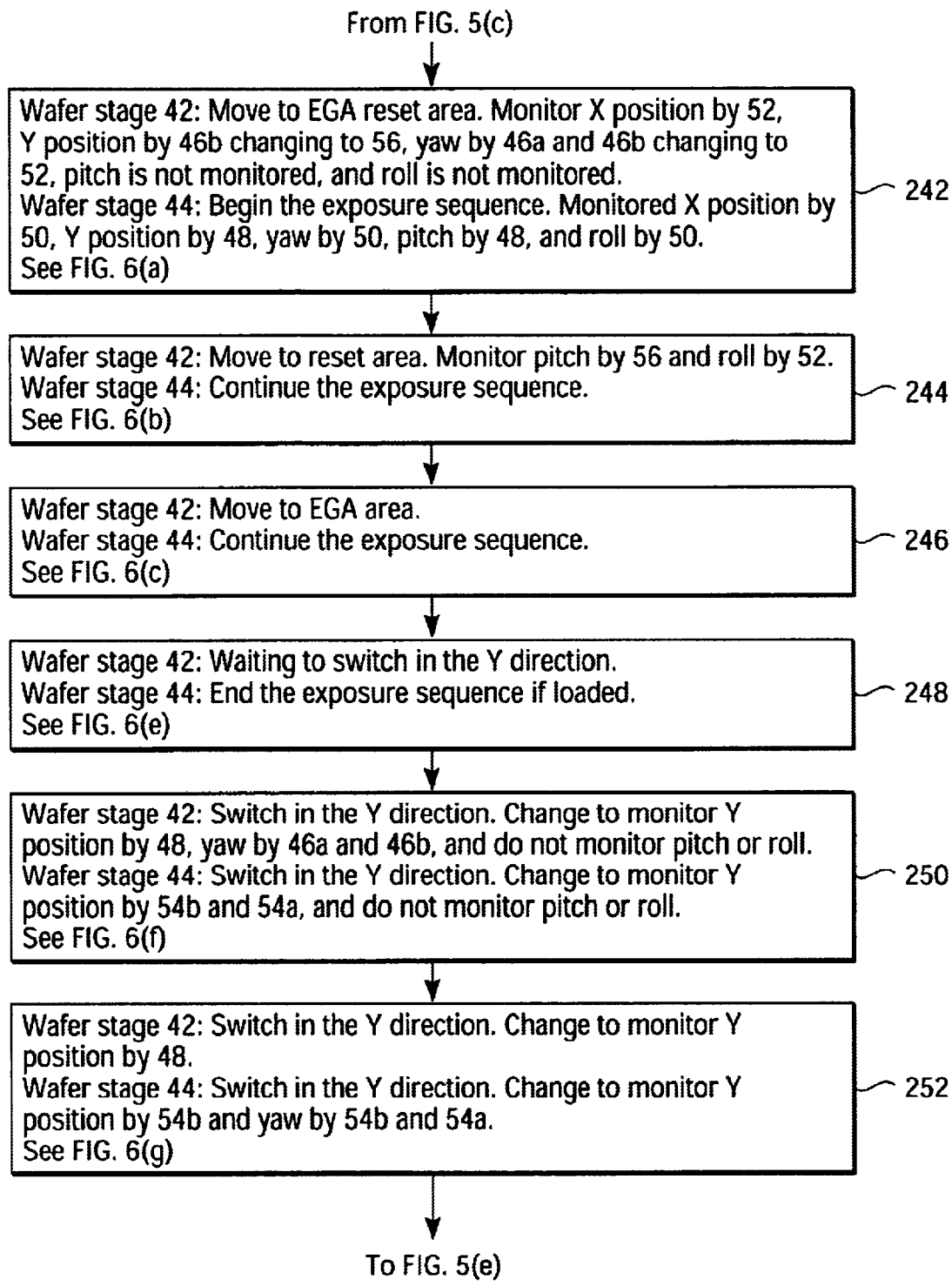
Figure 5E:
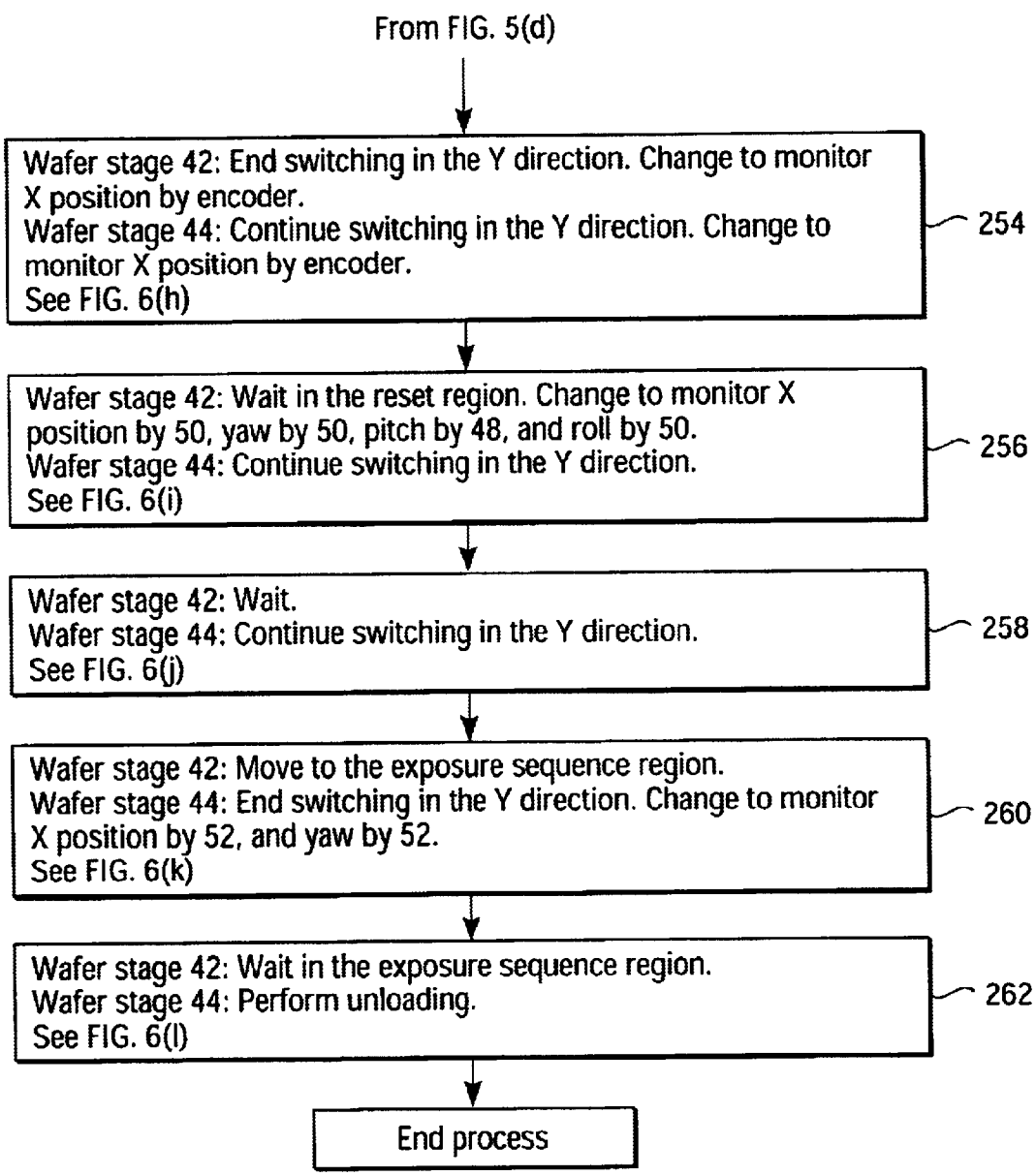

FIGS. 5(*a*)–(*c*) is a flowchart of a preferred method for utilizing the two wafer stage method of the present invention. The flowchart illustrates interferometer and encoder use during the movement of the stages. Individual steps in the flowchart are discussed in more detail in the referenced sub-illustrations of FIGS. 6(*a*)–(*t*).

Referring again to FIG. 5, in step 200, further illustrated by FIG. 6(*a*), first wafer stage 42 is loaded and its X position is monitored by interferometer 52, Y position by interferometer 46b changing to 56, yaw is monitored by interferometers 46a and 46b changing to 52, pitch is not monitored, and roll is not monitored. Second wafer stage 44 is beginning the exposure sequence if loaded with a wafer and its X position is monitored by interferometer 50, Y position by interferometer 48, yaw by interferometer 50, pitch by interferometer 48, and roll by interferometer 50.

In step 202, further illustrated by FIG. 6(*b*), first wafer stage 42 is reset and its X position is monitored by interferometer 52, Y position by interferometer 56, yaw by interferometer 52, pitch by interferometer 56, and roll by interferometer 52. Second wafer stage 44 continues the exposure sequence if loaded with a wafer and its X position is monitored by interferometer 50, Y position by interferometer 48, pitch by interferometer 48, yaw by interferometer 50, and roll by interferometer 50.

It should be noted that resetting is necessary whenever the reticle has been moved or changed, but thereafter the frequency of resets is determined by the stability of the apparatus. The method illustrated by FIGS. 5(*a*)–(*c*) and 6(*a*)–(*t*) contains, practically speaking, the most resets possible. Some of these would be deleted when using a more positionally stable apparatus.

In step 204, further illustrated by FIG. 6(*c*), first wafer stage 42 continues enhanced global alignment and its X position is monitored by interferometer 52, Y position by interferometer 56, yaw by interferometer 52, pitch by interferometer 56, and roll by interferometer 52. Second wafer stage 44 continues the exposure sequence if loaded with a wafer and its X position is monitored by interferometer 50, Y position by interferometer 48, yaw by interferometer 50, pitch by interferometer 48, and roll by interferometer 50.

In step 206, further illustrated by FIG. 6(*d*), first wafer stage 42 ends enhanced global alignment and its X position is monitored by interferometer 52, Y position by interferometer 56, yaw by interferometer 52, pitch by interferometer 56, and roll by interferometer 52. Second wafer stage 44 continues the exposure sequence if loaded with a wafer and its X position is monitored by interferometer 50, Y position by interferometer 48, yaw by interferometer 50, pitch by interferometer 48, and roll by interferometer 50.

In step 208, further illustrated by FIG. 6(*e*), first wafer stage 42 is waiting in position and its X position is monitored by interferometer 52, Y position by interferometer 56, yaw by interferometer 52, pitch by interferometer 56, and roll by interferometer 52. Second wafer stage 44 ends the exposure sequence if loaded with a wafer and its X position is monitored by interferometer 50, Y position by interferometer 48, yaw by interferometer 50, pitch by interferometer 48, and roll by interferometer 50.

In step 210, further illustrated by FIG. 6(*f*), first wafer stage 42 starts to switch in the Y direction and its X position is monitored by interferometer 52, Y position by interferometer 56 changing to 48, yaw by interferometer 52 changing to interferometers 46a and 46b, pitch is not monitored, and roll is not monitored. Second wafer stage 44 starts to switch in the Y direction and its X position is monitored by interferometer 50, Y position by interferometer 48 changing to interferometers 54a and 54b, yaw by interferometer 50, pitch is not monitored, and roll is not monitored.

Figure 6A:
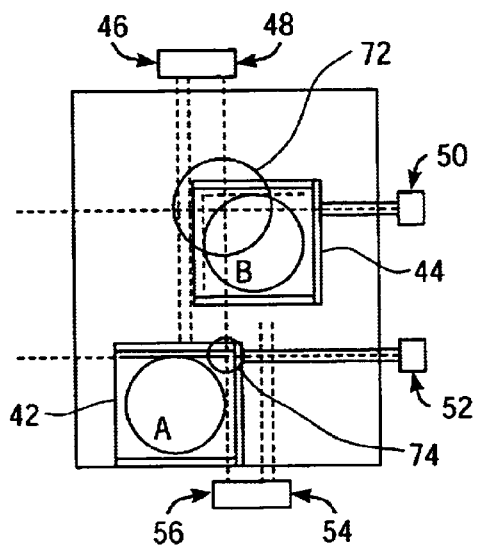
FIGS. 6(a)–(t) illustrate steps 1–20 of the method shown in FIGS. 5(a)–(c).
Figure 6B:
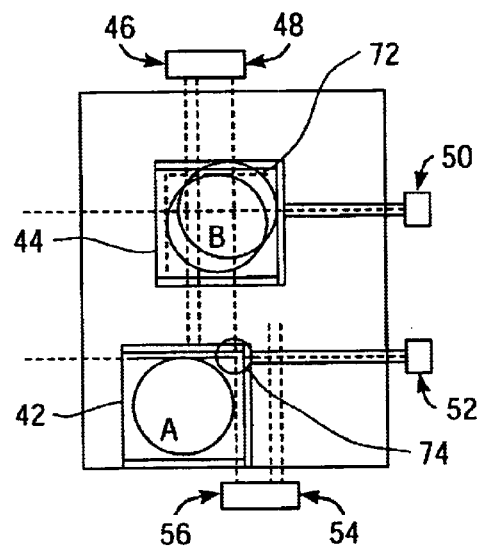
Figure 6C:
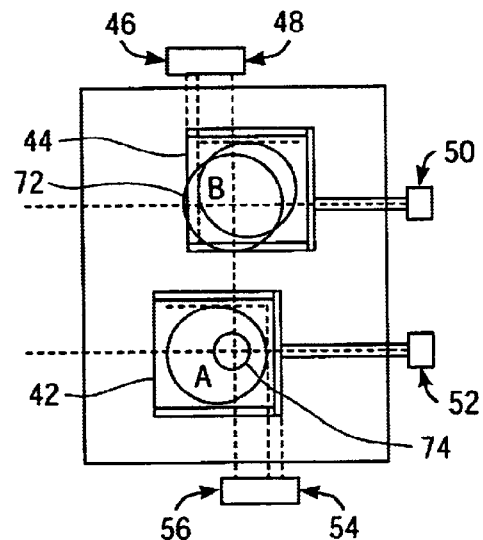
Figure 6D:
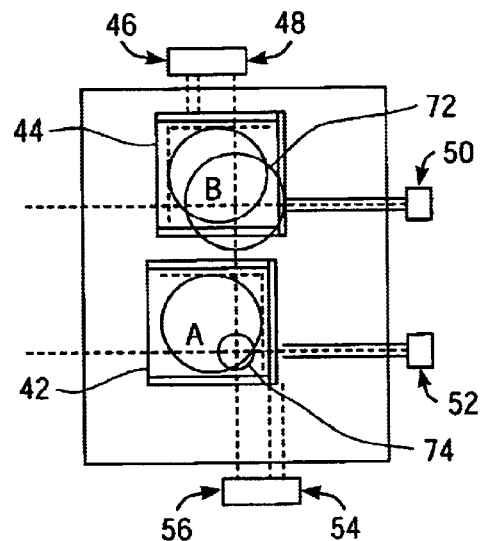
Figure 6E:
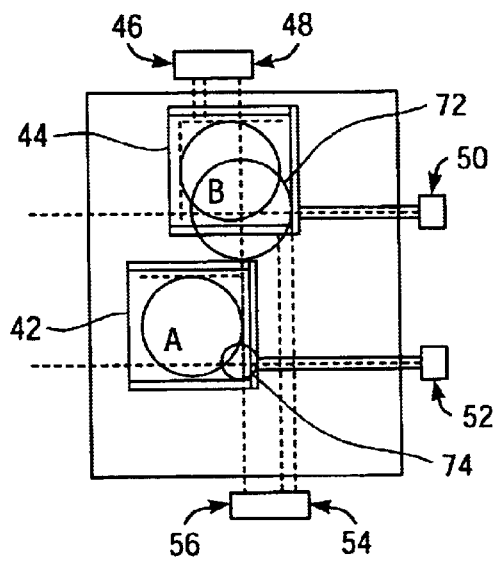
Figure 6F:
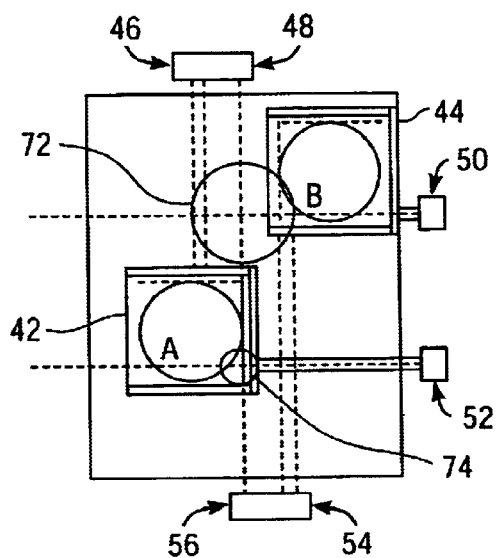
Figure 6G:
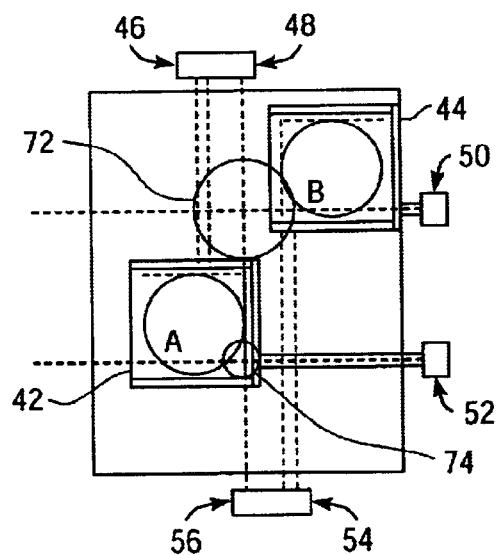

In step 212, further illustrated by FIG. 6(g), first wafer stage 42 is switching in the Y direction and its X position is monitored by interferometer 52, Y position by interferometer 56 changing to interferometer 48, yaw by interferometer 52 changing to interferometers 46a and 46b, pitch is not monitored, and roll is not monitored. Second wafer stage 44 starts to switch in the Y direction and its X position is monitored by interferometer 50, Y position by interferometer 54b, yaw by interferometer 50 changing to interferometers 54a and 54b, pitch is not monitored, and roll is not monitored.

Figure 6H:
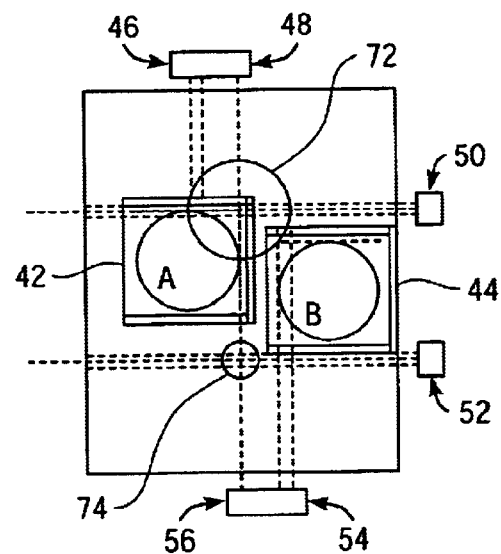

In step 214, further illustrated by FIG. 6(h), first wafer stage 42 ends switching in the X direction and its X position is monitored by encoder 55, Y position by interferometer 48, yaw by interferometer 46a and 46b, pitch is not monitored, and roll is not monitored. Second wafer stage 44 is switching in the Y direction and its X position is monitored by encoder 57, Y position by interferometer 54b, yaw by interferometers 54a and 54b, pitch is not monitored, and roll is not monitored.

Figure 6I:
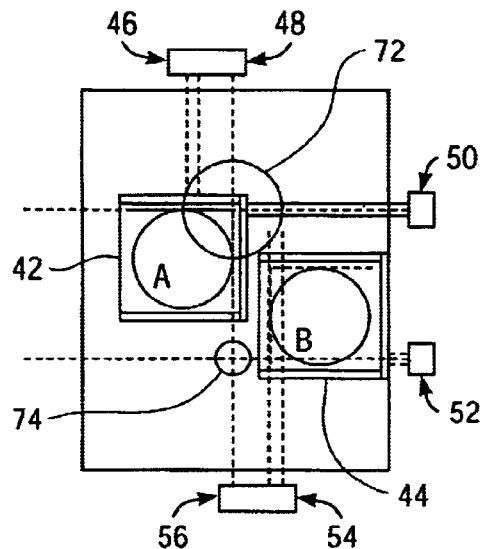

In step 216, further illustrated by FIG. 6(i), first wafer stage 42 is X position is reset and its X position is monitored by interferometer 50, Y position by interferometer 48, yaw by interferometers 46a and 46b changing to interferometer 50, pitch by interferometer 48, and roll by interferometer 50. Second wafer stage 44 is switching in the Y direction and its X position is monitored by encoder 57, Y position by interferometer 54b, yaw by interferometers 54a and 54b, pitch is not monitored, and roll is not monitored.

Figure 6J:
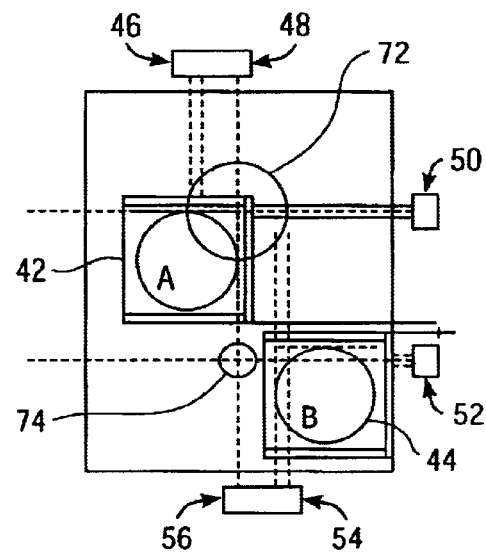

In step 218, further illustrated by FIG. 6(j), first wafer stage 42 is waiting in position and its X position is monitored by interferometer 50, Y position by interferometer 48, yaw by interferometer 50, pitch by interferometer 48, and roll by interferometer 50. Second wafer stage 44 is switching in the Y direction and its X position is monitored by encoder 57, Y position by interferometer 54b, yaw by interferometers 54a and 54b, pitch is not monitored, and roll is not monitored.

Figure 6K:
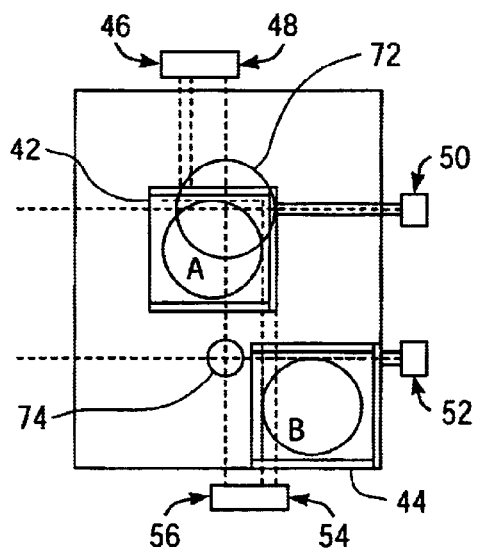

In step 220, further illustrated by FIG. 6(k), first wafer stage 42 starts the exposure sequence and its X position is monitored by interferometer 50, Y position by interferometer 48, yaw by interferometer 50, pitch by interferometer 48, and roll by interferometer 50. Second wafer stage 44 ends switching in the Y direction and its X position is monitored by interferometer 52, Y position by interferometer 54b, yaw by interferometers 54a and 54b changing to interferometer 52, pitch is not monitored, and roll is not monitored.

Figure 6L:
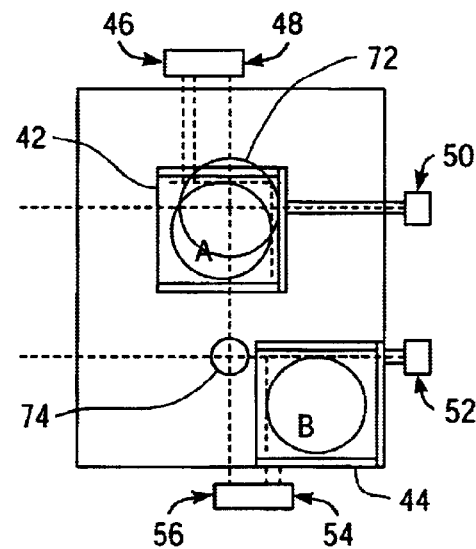

In step 222, further illustrated by FIG. 6(l), first wafer stage 42 continues the exposure sequence and its X position is monitored by interferometer 50, Y position by interferometer 48, yaw by interferometer 50, pitch by interferometer 48, and roll by interferometer 50. Second wafer stage 44 is loaded and/or unloaded and its X position is monitored by interferometer 52, Y position by interferometer 54b, yaw by interferometer 52, pitch is not monitored, and roll is not monitored.

Figure 6M:
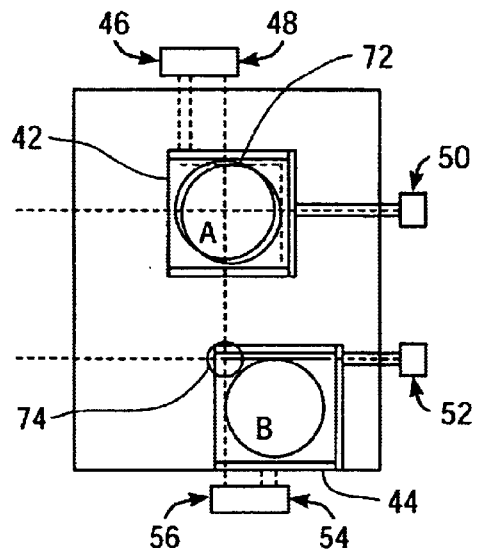

In step 224, further illustrated by FIG. 6(m), first wafer stage 42 continues the exposure sequence and its X position is monitored by interferometer 50, Y position by interferometer 48, yaw by interferometer 50, pitch by interferometer 48, and roll by interferometer 50. Second wafer stage 44 is reset and its X position is monitored by interferometer 52, Y position by interferometer 54b changing to 56, yaw by interferometer 52, pitch by interferometer 56, and roll by interferometer 52.

Figure 6N:
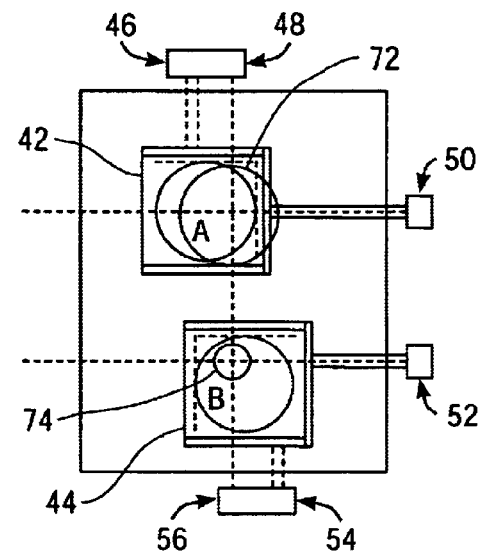

In step 226, further illustrated by FIG. 6(n), first wafer stage 42 continues the exposure sequence and its X position is monitored by interferometer 50, Y position by interferometer 48, yaw by interferometer 50, pitch by interferometer 48, and roll by interferometer 50. Second wafer stage 44 continues enhanced global alignment and its X position is monitored by interferometer 52, Y position by interferometer 56, yaw by interferometer 52, pitch by interferometer 56, and roll by interferometer 52.

Figure 6O:
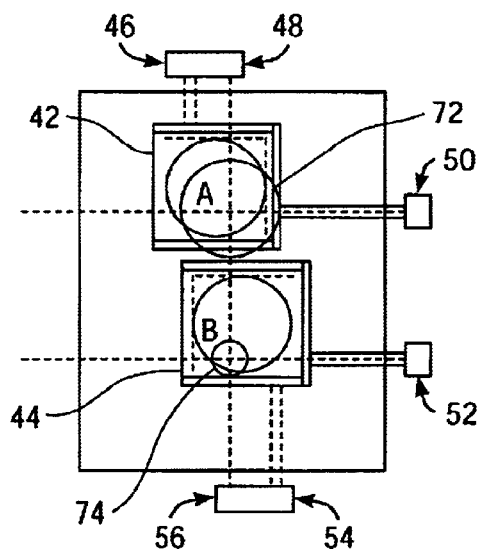

In step 228, further illustrated by FIG. 6(o), first wafer stage 42 continues the exposure sequence and its X position is monitored by interferometer 50, Y position by interferometer 48, yaw by interferometer 50, pitch by interferometer 48, and roll by interferometer 50. Second wafer stage 44 ends enhanced global alignment and its X position is monitored by interferometer 52, Y position by interferometer 56, yaw by interferometer 52, pitch by interferometer 56, and roll by interferometer 52.

Figure 6P:
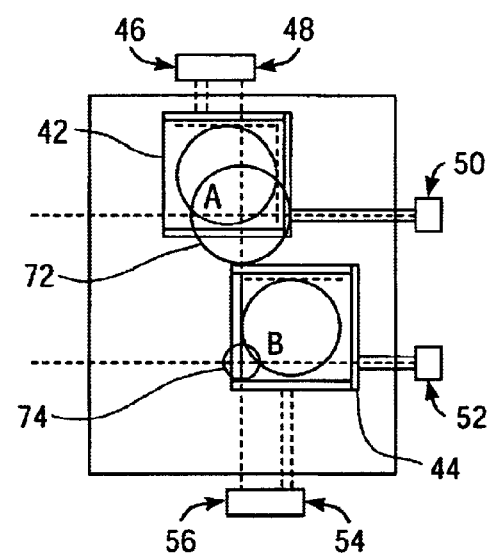

Now referring to FIG. 5(b), in step 230, further illustrated by FIG. 6(p), first wafer stage 42 continues the exposure sequence and its X position is monitored by interferometer 50, Y position by interferometer 48, yaw by interferometer 50, pitch by interferometer 48, and roll by interferometer 50. Second wafer stage 44 starts to switch in the X direction and its X position is monitored by interferometer 52, Y position by interferometer 56, yaw by interferometer 52 changing to interferometers 54a and 54b, pitch is not monitored, and roll is not monitored.

Figure 6Q:
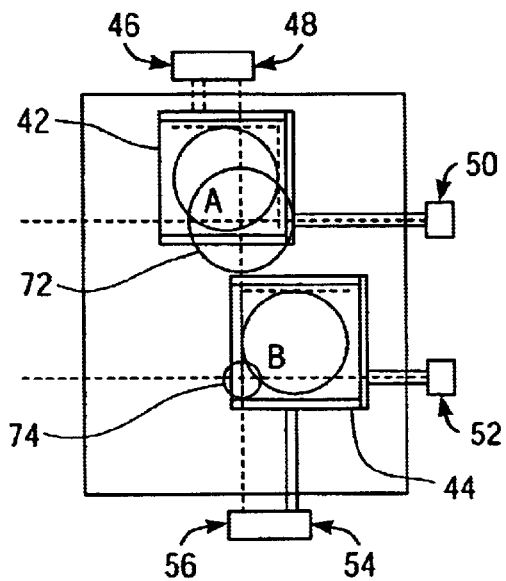

In step 232, further illustrated by FIG. 6(q), first wafer stage 42 ends the exposure sequence and its X position is monitored by interferometer 50, Y position by interferometer 48 changing to interferometer 46b, yaw by interferometer 50 changing to interferometers 46a and 46b, pitch by interferometer 48, and roll by interferometer 50. Second wafer stage 44 is waiting in position and its X position is monitored by interferometer 52, Y position by interferometer 56, yaw by interferometers 54a and 54b, pitch is not monitored, and roll is not monitored.

Figure 6R:
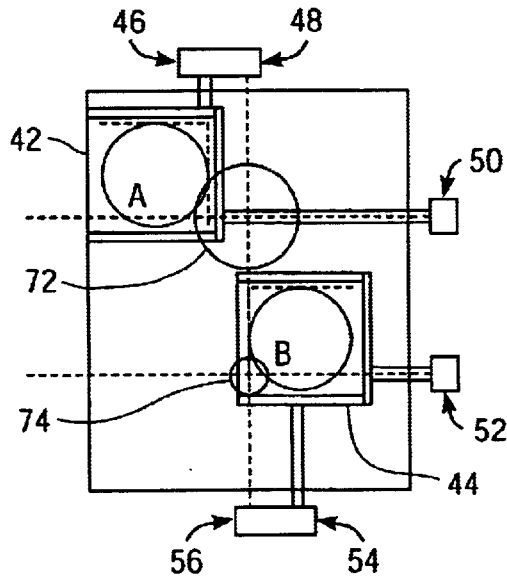

In step 234, further illustrated by FIG. 6(r), first wafer stage 42 starts to switch in the X direction and its X position is monitored by encoder 55, Y position by interferometer 46b, yaw by interferometer 46a and 46b, pitch is not monitored, and roll is not monitored. Second wafer stage 44 is waiting in position and its X position is monitored by interferometer 52, Y position by interferometer 56 changing to interferometer 48, yaw by interferometers 54a and 54b, pitch is not monitored, and roll is not monitored.

Figure 6S:
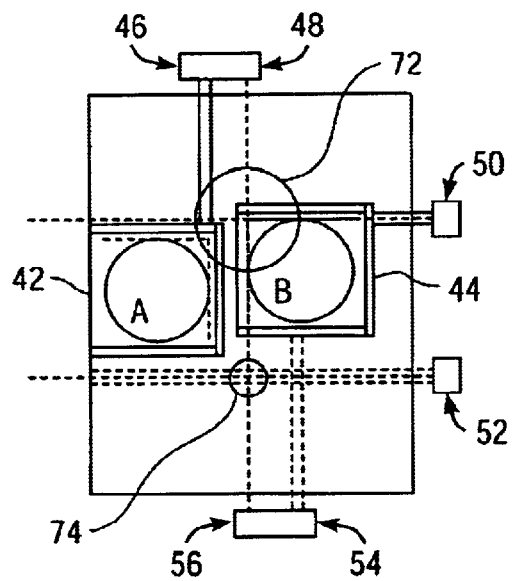

In step 236, further illustrated by FIG. 6(s), first wafer stage 42 is switching in the X direction and its X position is monitored by encoder 55, Y position by interferometer 46b, yaw by interferometer 46a and 46b, pitch is not monitored, and roll is not monitored. Second wafer stage 44 ends switching in the X direction and its X position is monitored by encoder 57, Y position by interferometer 48, yaw by interferometer 54a and 54b, pitch is not monitored, and roll is not monitored.

Figure 6T:
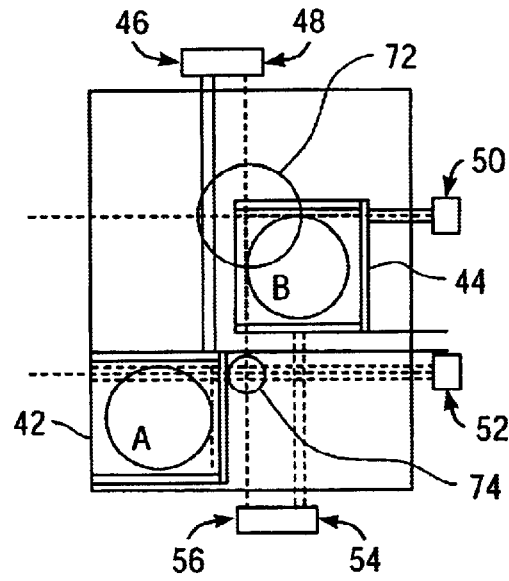

In step 238, further illustrated by FIG. 6(t), first wafer stage 42 is switching in the X direction and its X position is monitored by encoder 55, Y position by interferometer 46b, yaw by interferometer 46a and 46b, pitch is not monitored, and roll is not monitored. Second wafer stage 44 is reset and its X position is monitored by interferometer 50, Y position by interferometer 48, yaw by interferometer 54a and 54b changing to interferometer 50, pitch by interferometer 48, and roll by interferometer 50.

Step 240 is the decision block for whether to continue to process more wafers. Should the answer be "yes" the method returns to step 200 of FIG. 5(a) and continues in sequence, otherwise the method continues to step 244 which is also illustrated by FIG. 6(a), except the actions taken differ.

In step 242, further illustrated by FIG. 6(a), first wafer stage 42 is unloaded and its X position is monitored by interferometer 52, Y position by interferometer 46b changing to 56, yaw by interferometer 46a and 46b changing to 52, pitch is not monitored, and roll is not monitored. Second wafer stage 44 begins the exposure sequence and its X position is monitored by interferometer 50, Y position by interferometer 48, yaw by interferometer 50, pitch by interferometer 48, and roll by interferometer 50.

In step 244, further illustrated by FIG. 6(b), first wafer stage 42 is in the reset area and its X position is monitored by interferometer 52, Y position by interferometer 56, yaw by interferometer 52, pitch by interferometer 56, and roll by interferometer 52. Second wafer stage 44 continues the exposure sequence and its X position is monitored by interferometer 50, Y position by interferometer 48, pitch by interferometer 48, yaw by interferometer 50, and roll by interferometer 50.

In step 246, further illustrated by FIG. 6(c), first wafer stage 42 is in the enhanced global alignment area and its X position is monitored by interferometer 52, Y position by interferometer 56, yaw by interferometer 52, pitch by interferometer 56, and roll by interferometer 52. Second wafer stage 44 continues the exposure sequence and its X position is monitored by interferometer 50, Y position by interferometer 48, yaw by interferometer 50, pitch by interferometer 48, and roll by interferometer 50.

Now referring to FIG. 5(c), in step 248, further illustrated by FIG. 6(e), first wafer stage 42 is waiting in position and its X position is monitored by interferometer 52, Y position by interferometer 56, yaw by interferometer 52, pitch by interferometer 56, and roll by interferometer 52. Second wafer stage 44 ends the exposure sequence and its X position is monitored by interferometer 50, Y position by interferometer 48, yaw by interferometer 50, pitch by interferometer 48, and roll by interferometer 50.

In step 250, further illustrated by FIG. 6(f), first wafer stage 42 starts to switch in the Y direction and its X position is monitored by interferometer 52, Y position by interferometer 56 changing to 48, yaw by interferometer 52 changing to interferometers 46a and 46b, pitch is not monitored, and roll is not monitored. Second wafer stage 44 starts to switch in the Y direction and its X position is monitored by interferometer 50, Y position by interferometer 48 changing to interferometers 54a and 54b, yaw by interferometer 50, pitch is not monitored, and roll is not monitored.

In step 252, further illustrated by FIG. 6(g), first wafer stage 42 is switching in the Y direction and its X position is monitored by interferometer 52, Y position by interferometer 56 changing to interferometer 48, yaw by interferometer 52 changing to interferometers 46a and 46b, pitch is not monitored, and roll is not monitored. Second wafer stage 44 is switching in the Y direction and its X position is monitored by interferometer 50, Y position by interferometer 54b, yaw by interferometer 50 changing to interferometers 54a and 54b, pitch is not monitored, and roll is not monitored.

In step 254, further illustrated by FIG. 6(h), first wafer stage 42 ends switching in the X direction and its X position is monitored by encoder 55, Y position by interferometer 48, yaw by interferometer 46a and 46b, pitch is not monitored, and roll is not monitored. Second wafer stage 44 is switching in the Y direction and its X position is monitored by encoder 57, Y position by interferometer 54b, yaw by interferometers 54a and 54b, pitch is not monitored, and roll is not monitored.

In step 256, further illustrated by FIG. 6(i), first wafer stage 42 is in the reset area and its X position is monitored by interferometer 50, Y position by interferometer 48, yaw by interferometers 46a and 46b changing to interferometer 50, pitch by interferometer 48, and roll by interferometer 50. Second wafer stage 44 is switching in the Y direction and its X position is monitored by encoder 57, Y position by interferometer 54b, yaw by interferometers 54a and 54b, pitch is not monitored, and roll is not monitored.

In step 258, further illustrated by FIG. 6(j), first wafer stage 42 is waiting in position and its X position is monitored by interferometer 50, Y position by interferometer 48, yaw by interferometer 50, pitch by interferometer 48, and roll by interferometer 50. Second wafer stage 44 is switching in the Y direction and its X position is monitored by encoder 57, Y position by interferometer 54b, yaw by interferometers 54a and 54b, pitch is not monitored, and roll is not monitored.

In step 260, further illustrated by FIG. 6(k), first wafer stage 42 is in the exposure area and its X position is monitored by interferometer 50, Y position by interferometer 48, yaw by interferometer 50, pitch by interferometer 48, and roll by interferometer 50. Second wafer stage 44 ends switching in the Y direction and its X position is monitored by interferometer 52, Y position by interferometer 54b, yaw by interferometers 54a and 54b changing to interferometer 52, pitch is not monitored, and roll is not monitored.

In step 262, further illustrated by FIG. 6(l), first wafer stage 42 is in the exposure area and its X position is monitored by interferometer 50, Y position by interferometer 48, yaw by interferometer 50, pitch by interferometer 48, and roll by interferometer 50. Second wafer stage 44 is unloading and its X position is monitored by interferometer 52, Y position by interferometer 54b, yaw by interferometer 52, pitch is not monitored, and roll is not monitored. The unloading of second wafer stage 44 ends the method.

The use of the two stage method described herein is not limited to a lithography system for semiconductor manufacturing. This arrangement may be employed advantageously in other assemblies wherein objects other than wafers must be precisely positioned while they are processed simultaneously. The apparatus, for example, can be used as an LCD lithography system that exposes a liquid crystal display device pattern onto a rectangular glass plate or a lithography system for manufacturing a thin film magnetic head. Furthermore, the two stage method can also be applied to a proximity lithography system that exposes a reticle pattern by closely locating a reticle and a substrate without the use of a lens assembly. Additionally, a two stage method according to the invention can be used in other devices, including other semiconductor processing equipment, machine tools, metal cutting machines, and inspection machines.

It is to be understood that while illustrative embodiments of the invention have been shown and described herein, various changes and adaptions in accordance with the teachings of the invention will be apparent to those of skill in the art. Such changes and adaptions nevertheless are included within the spirit and scope of the invention as defined in the following claims.

I claim:

1. A method of employing a lithography apparatus and a stage assembly with a first and a second stage in a lithography process, the method comprising:

exposing a pattern on a first substrate disposed on a first stage in said lithography apparatus;

loading a second substrate for processing on a second stage and aligning said loaded substrate on said second stage, said loading and aligning together comprising at least part of a preparing step of said method;

resetting said apparatus at least once;

removing said first substrate from said first stage;

positioning said first stage for a subsequent preparing step;

positioning said second stage for a subsequent exposing step;

determining the locations of said first and said second stages employing a plurality of interferometers and a plurality of encoders, wherein said interferometers are employed to determine the positions of said first and said second stages during said exposing step, during said preparing step, and during said resetting step and wherein both said interferometers and said encoders are employed during said positioning steps; and wherein said preparing step, said at least one resetting step, and said positioning steps occur at least partly simultaneously with said exposing step.

2. The method of claim 1, wherein both said aligning step and said exposing step are preceded by one said resetting step.

3. The method of claim 1, wherein said assembly comprises an electron beam exposure apparatus.

4. The method of claim 1, wherein said exposure assembly comprises an x-ray exposure apparatus.

5. The method of claim 1, wherein said assembly comprises a photolithography apparatus.

6. The method of claim 1, wherein said process further comprises a step-and-repeat method.

7. The method of claim 1, wherein said process further comprises a step-and-scan method.

8. A method of employing a lithography apparatus and a stage assembly with a first and a second stage in a lithography process, the method comprising:

continuously monitoring the positions of a first stage and a second stage during the processing of substrates, said processing comprising a plurality of steps wherein a first group of said steps is directed at changing said positions of said stages and a second group of said steps is directed at effectuating changes to said substrates;

employing a plurality of interferometers and a plurality of encoders for said monitoring during said first group of steps;

employing said interferometers for said monitoring during said second group of steps; and moving said first and said second stages so that when one said stage is undergoing one step from one said group said other stage is undergoing at least part of one or more of the remaining steps from said first or said second groups.

9. The method of claim 8, wherein said second group of steps comprises:

exposing said substrates;

reseting said apparatus;

aligning said substrates;

unloading said stage; and loading said stages.

10. The method of claim 9, said method further comprising exposing said first substrate while positioning said second stage, while loading or unloading said second stage; while reseting said second stage, and while aligning said second substrate.

11. The method of claim 10, said method further comprising exposing said second substrate while positioning said first stage, while loading or unloading said first substrate, while reseting said first stage, and while aligning said first stage.

12. The method of claim 11, said method further comprising reseting said first stage while positioning said second stage and positioning said first stage while reseting said second stage.

13. The method of claim 8, wherein said lithography apparatus comprises an electron beam exposure apparatus.

14. The method of claim 8, wherein said lithography apparatus comprises an x-ray exposure apparatus.

15. The method of claim 8, wherein said process further comprises a step-and-repeat method.

16. The method of claim 8, wherein said process further comprises a step-and-scan method.

* * * * *

UNITED STATES PATENT AND TRADEMARK OFFICE
CERTIFICATE OF CORRECTION

PATENT NO.   : 6,665,054 B2
DATED        : December 16, 2003
INVENTOR(S)  : Fuyuhiko Inoue It is certified that error appears in the above-identified patent and that said Letters Patent is hereby corrected as shown below:

<u>Column 12,</u>
Lines 21, 28, 33, 36, 37 and 21, replace "reseting" with -- resetting --; and
Line 33, replace "and" with -- or --.

Signed and Sealed this

Sixteenth Day of March, 2004

JON W. DUDAS
*Acting Director of the United States Patent and Trademark Office*